United States Patent [19]

Hälg et al.

[11] Patent Number: 4,963,954
[45] Date of Patent: Oct. 16, 1990

[54] ARRANGEMENT FOR REDUCING PIEZOELECTRIC EFFECTS IN AN ELECTRICAL COMPONENT

[75] Inventors: Beat Hälg; Radivoje Popovic, both of Zug, Switzerland

[73] Assignee: LGZ Landis & Gyr Zug, Zug, Switzerland

[21] Appl. No.: 340,273

[22] Filed: Apr. 19, 1989

[30] Foreign Application Priority Data

Apr. 26, 1988 [CH] Switzerland .................. 1560/88

[51] Int. Cl.⁵ .................. H01L 29/84; H01L 29/96; H01L 27/02
[52] U.S. Cl. .................. 357/26; 357/51; 357/55
[58] Field of Search .................. 357/26, 51, 55, 50

[56] References Cited

U.S. PATENT DOCUMENTS

| | | | |
|---|---|---|---|
| 4,033,787 | 7/1977 | Marshall | 357/26 X |
| 4,485,551 | 12/1984 | Soclof | 357/50 X |
| 4,517,486 | 5/1985 | Andrews | 357/26 X |

OTHER PUBLICATIONS

K. M. Schlesier, S. A. Keneman, R. T. Mooney, "Piezoresistivity Effects in Plastic-Encapsulated Integrated Circuits", 590 RCA Review, vol. 43, Dec. 1982.
Michael Feil et al, "Hybridintegration", Heidelberg Germany, 1986.
Y. Kanda and M. Migitaka, "Effect of Mechanical Stress on the Offset Voltages of Hall Devices in Si 1C", Central Research Lab, Hitachi, Ltd., Japan.
Y. Kanda and M. Migitaka, "Design Consideration for Hall Devices in Si IC", Central Research Lab, Hitachi, Ltd., Japan.

*Primary Examiner*—Rolf Hille
*Assistant Examiner*—R. Potter
*Attorney, Agent, or Firm*—Marmorek, Guttman & Rubenstein

[57] ABSTRACT

An arrangement for reducing piezo-electric effects in piezo-electric effect sensitive electrical components formed in a semiconductor body is disclosed. The piezo-electric effect sensitive component or components are located in a particular zone of the semiconductor body. The semiconductor body is in general mounted on a support. However, the zone of the semiconductor body containing the piezo-electric sensitive component or components is not attached to the support but instead is separated from the support by a space. The presence of the space results in a certain degree of mechanical isolation of the part of the semiconductor body which contains the piezo-electric effect sensitive components, whereby the negative influence of the piezo-electric effect on the long term stability of an instrument utilizing the semiconductor body is reduced.

14 Claims, 2 Drawing Sheets

ARRANGEMENT FOR REDUCING PIEZOELECTRIC EFFECTS IN AN ELECTRICAL COMPONENT

FIELD OF THE INVENTION

The present invention relates to an arrangement for the reduction of piezoelectric effects in at least one piezoelectric effect-sensitive electrical component located in a semiconductor body and to a process for the production of said arrangement.

BACKGROUND OF THE INVENTION

The parameters of all components made of semiconductor material are functions of the mechanical state of tension of the semiconductor material. This phenomenon is known under the name piezoelectric effect and is especially pronounced in resistors and Hall elements, for example. When such piezoelectric effect-sensitive components are used in precision instruments such as electricity meters, problems arise in precision and long-term stability that are not solved easily, in particular when the components are being incorporated into integrated circuits. This is because the installation of chips in a housing and/or on a mechanical support results in thermo-mechanical tensions which are difficult to control and thereby lead to undesirable piezoelectric effects. Because of this, important parameters of the components used can assume values which do not correspond to the calculated or desired values. Due to different thermal and/or mechanical tensions from chip to chip the parameter values can furthermore be subject to wide scattering and to great changes leading to problems of precision and longterm stability It is known from the following documents and the following book:

Phys. stat. sol (a) 35, K115 to K118 (1976), "Effect of mechanical stress on the offset voltage of Hall devices in Si IC", Y. Kanda and M. Migitaka, Phys. Stat. Sol. (a) 38, K41 to K44 (1976), "Design Consideration for Hall devices in Si IC", Y. Kanda and M. Migitaka, RCA Review, Vol. 43, December 1982, pages 590 to 607, "Piezoresistivity Effects in Plastic-Encapsulated Integrated Circuits", K.M. Schleiser, S.A. Keneman and R.T. Mooney, and "Hybridintegration, Technologie und Entwurf von Dickschichtschaltungen", Hüthig-Verlag, Heidelberg, 1986, pages 214 to 217, M. Feil, A. Kolbeck, P. Lenk, H. Reichl and E. Ziegler that piezoelectric effects can be minimized through an optimal selection of the crystal orientation (100), (110) or (111) of the wafer material, through optimal selection of the spacial direction of the critical components in relation to the crystal lattice of the wafer material used or through utilization of an appropriate installation of the chips, e.g. by means of so-called "flip-chip bonding".

It is the object of the present invention to provide an arrangement which cancels out or at least significantly reduces the negative influences of piezoelectric effects which are due to installation, in particular their negative effect on the precision and the longterm stability of a electronic precision circuit made of semiconducting components. The arrangement according to the invention is therefore used for the mechanical isolation of the electric components which are sensitive to piezoelectric effects, and thus to free them to the greatest possible extent from thermo-mechanical tensions which are due to installation.

SUMMARY OF THE INVENTION

The present invention is an arrangement which reduces piezoelectric effects in piezo-electric effect sensitive electrical components formed in a semiconductor body. The piezo-electric effect sensitive component or components are located in a particular zone of the semiconductor body. The semiconductor body is in general mounted on a support. However, the zone of the semiconductor body which contains the piezo-electric sensitive component or components is not attached to the support but is instead separated from the support by a space. The presence of the space results in a certain degree of mechanical isolation for the portion of the semiconductor body which contains the piezo-electric effect sensitive components, whereby the negative influence of the piezo-electric effect on the long term stability of an instrument utilizing the semiconductor body is reduced.

Figure 1:
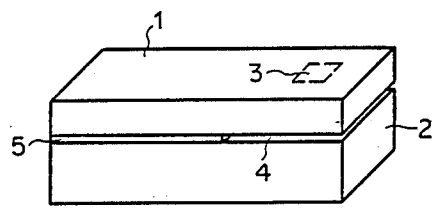
FIG. 1 shows a first embodiment of an arrangement for reducing piezo-electric effects in semiconductor components in accordance with the present invention.

The figures shown in the drawing do not claim to be complete. In particular, no connections, bonding and wiring are shown.

DETAILED DESCRIPTION OF THE INVENTION

In all four embodiments, the arrangement according to the present invention contains a semiconductor body in the form of a layer of semiconducting material 1, a support 2 and at least one piezoelectric effect-sensitive electric component 3. The semiconducting body can be a silicon chip and the support 2 a ceramic substrate When several interrelated electric components are present, they are preferably combined together into an electric circuit arrangement or integrated circuit. The semiconducting layer 1 is spatially always considerably larger than the total space taken up by all the piezoelectric effect-sensitive electric components 3. That space is shown in the drawings in form of a surface which is surrounded by a broken line. All interrelated electric components 3 are placed in concentration in a spatially limited portion of the semiconducting layer 1 so that only a portion of the semiconducting layer 1 is occupied by the piezoelectric effect-sensitive component 3 or by the interrelated piezoelectric effect-sensitive components 3. The semiconducting layer 1 is in each case installed on a supporting surface of the support 2, i.e. glued or eutectically bonded by means of a metal. Between the part of the semiconducting layer 1 which is occupied by the piezoelectric effect-sensitive electric component 3 or by the interrelated piezoelectric effect-sensitive electric components 3 and the related portion of the support material 2, a space 4 is provided in such manner that the part of the semiconducting layer 1 which is occupied by the piezoelectric effect-sensitive electric component 3 or by the interrelated piezoelectric effect-sensitive electric components 3 extends in an overhanging manner above the supporting surface of the support 2. In all the illustrated embodiments of the invention, a thin layer made of a connecting material 5 is provided between the semiconducting layer 1 and the support 2, whereby the connecting material 5 is either an adhesive or a metal, e.g. gold. In the first and second embodiments of the arrangement according to the present invention, at least that portion of the semiconducting layer 1 which is occupied by the piezoelectric effect-sensitive electric component 3 or by the interrelated piezoelectric effect-sensitive electric components 3 is preferably of nearly constant thickness.

The layer of semiconducting material 1 and of support material 2 used according to FIG. 1 in the first embodiment of the arrangement according to the present invention are both of nearly constant thickness, e.g. 0.3 mm to 2 mm thick. Between the semiconductor layer 1 and support layer 2, the thin layer of connecting material 5 is provided and is also of nearly constant thickness and installed alongside a common supporting surface on the support 2. The connecting material 5 is provided here only between a part of the support 2 and a corresponding part of the semiconducting layer 1 which is situated outside that part of the semiconducting layer 1 which contains the piezoelectric effect-sensitive electric component 3 or the piezoelectric effect-sensitive electric components 3. The layer of connecting material 5 has as a rule a thickness of at least 1 μm. The portion of the semiconducting material 1 which contains no components 3 is thus fixedly installed on the support material 2 which serves as its support, while the other part of the semiconducting material 1 which contains the component 3 or the components 3 is not directly connected to the support material 2 but is separated from the latter by the space 4 which is of nearly constant thickness, equal to that of the layer of connecting material 5.

Figure 2:
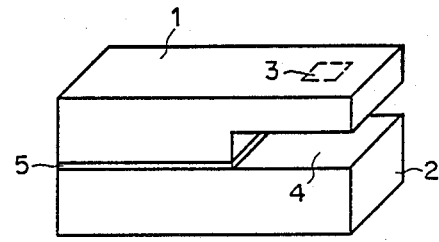
FIG. 2 shows a second embodiment of an arrangement for reducing piezo-electric effects in semiconductor components in accordance with the present invention.

The second embodiment of the arrangement according to the present invention shown in FIG. 2 is different from the first embodiment (FIG. 1) only in that the portion of the semiconducting layer 1 containing the piezoelectric effect-sensitive electric component 3 or the interrelated piezoelectric effect-sensitive electric components 3 is at least slightly thinner than the remaining portion of said semiconducting layer 1. That portion of the semiconducting layer 1 which contains the piezoelectric effect-sensitive electric component 3 or the interrelated piezoelectric effect-sensitive electric components 3 has no direct contact with the support 2 and preferably is separated from the support 2 by the space 4 which is again preferably of constant thickness. The thicker part of the semiconducting layer 1 is connected to the support 2 via the connecting material 5, whereby said connecting material 5 is again installed between a part of the support 2 and corresponding part of the semiconducting layer 1 which is other than that part of the semiconducting layer 1 containing the piezoelectric effect-sensitive electric component 3 or the piezoelectric effect-sensitive electric components 3.

Figure 3:
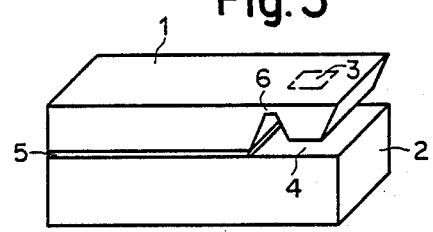
FIG. 3 shows a third embodiment of an arrangement for reducing piezo-electric effects in semiconductor components in accordance with the present invention.

The third embodiment of the arrangement according to the present invention shown in FIG. 3 is different from the second embodiment (FIG. 2) only in that the at least slightly thinner portion of the semiconducting layer 1 containing the piezoelectric effect-sensitive electric component 3 or the interrelated piezoelectric effect-sensitive electric components 3 is not connected directly but only via at least one intermediary link to the thicker portion of the semiconducting layer 1 containing no piezoelectric effect-sensitive electric component 3 which in turn is again installed on the support 2 by means of the connecting material 5. The intermediary link 6 is considerably thinner than the portion of the semiconducting layer 1 containing the piezoelectric effect-sensitive electric component 3 or the piezoelectric effect-sensitive electric components 3. The semiconducting layer 1 is thus divided into at least two parts by the markedly tapered intermediary link 6, whereby only one of the two parts is fixedly installed o the support 2 while the other part, which contains at least one of the piezoelectric effect-sensitive electric components 3 extends in an overhanging manner above the space 4. The overhanging part of the semiconducting layer 1 as well as the space 4 no longer are of constant thickness in the third embodiment of the arrangement according to the invention. The spacial transition between the parts of different thickness of the semiconducting layer 1 may be of any configuration. In FIG. 2 the transition is assumed to be ideal, whereby the change-over from the thin part to the thick part is sudden. In FIG. 3 the transition from the thicker as well as from the thinner part of the semiconducting layer 1 to the intermediary link 6 is assumed to be ideally linear so that trapezoid cross-sections are created. In practice the configuration of these transitions is however more often determined by the production method used which, as a rule, comprises at least one etching process.

Figure 4:
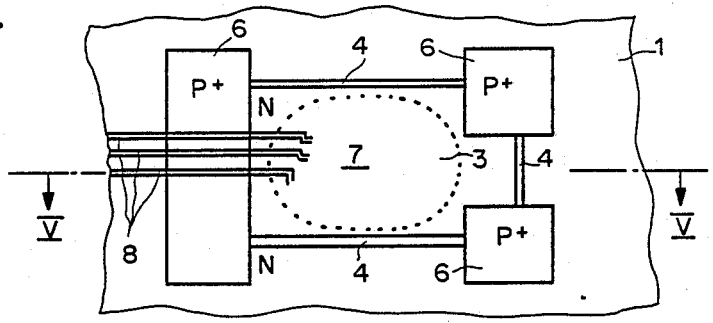
FIG. 4 shows a schematic top view of a fourth embodiment of an arrangement for reducing piezo-electric effects in semiconductor components in accordance with the present invention.
Figure 5:
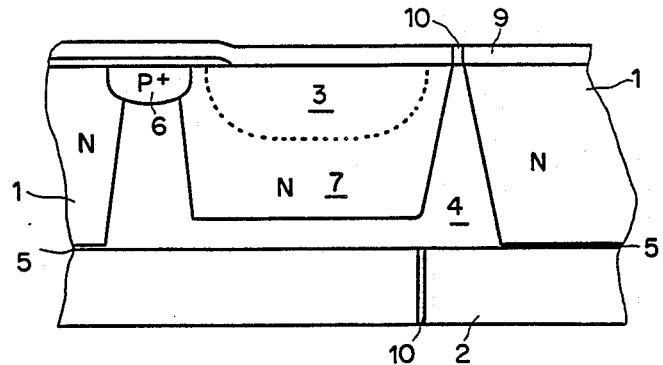
FIG. 5 shows a schematic cross-section of the device of FIG. 4 and FIGS. 6a to FIG. 6e show a schematic view of the different process steps in an illustrative method for producing the arrangement of FIGS. 4 and 5.

The fourth embodiment of the invention shown in FIGS. 4 and 5 is preferably used in integrated circuits and resembles the third embodiment (FIG. 3), with the difference that the entire layer of semiconducting material 1 is no longer divided into at least two parts by one or several intermediary links 6, but in that individual, isolated zones 7 are provided in the semiconducting layer 1 which are occupied by the piezoelectric effect-sensitive electric component 3 or by the interrelated piezoelectric effect-sensitive electric components 3 and which are at least slightly thinner than the other parts of the semiconducting layer 1 which in turn is installed on the support 2 in such manner that a space 4 is created between each zone 7 and the corresponding portion of the support 2, separating it thereby from the support 2 and at least partially from the rest of the semiconducting material 1. The mechanical connection of the zones 7 to the remaining part of the semiconducting layer 1 is established by at least one intermediary link 6 which surrounds a zone 7 at least in part laterally, said intermediary link 6 being significantly thinner than the zone 7. Each intermediary link 6 is preferably diffused into the surface of the semiconducting layer 1 in form of a trough, whereby the semiconducting layer 1 and the trough are of opposite conductivity type. When the zone 7 is surrounded laterally only in part by the link 6 it is separated laterally by the space 4 from the rest of the semiconducting layer 1.

In FIGS. 4 and 5 only one single isolated zone 7 which is connected via three links 6 to the remaining part of the semiconducting layer 1 is shown. In the fourth embodiment of the invention (FIGS. 4,5), the support 2 is preferably a substrate on the surface of which the semiconducting layer 1, e.g. with N-type conductivity, is located. The zone 7, as mentioned earlier, is slightly thinner than the remaining part of the semiconducting layer 1 which in turn is installed on a support 2 via a layer of connecting material 5 so that the space 4 is created between the zone 7 and the support 2. The isolated zone 7, which is also made of a semiconducting material of N-type conductivity and in which all the interrelated piezoelectric effect-sensitive electric components 3 are located is situated like an island in the semiconducting layer 1. The isolated zone 7 is surrounded at the bottom and laterally by the space 4 which is partially open at the top and is partially closed by the thin links 6. These thin links 6 are at the surface of the space 4 to ensure mechanical retention of the isolated zone 7 on the rest of the semiconducting layer 1. The links 6 are, as mentioned earlier, preferably in form of troughs made of P+-type material diffused at the extreme edge of the surface of the isolated zone 7 into the semiconducting layer 1 and which are markedly thinner than the isolated zone 7. At the top surface of the semiconducting layer 1, the piezoelectric effect-sensitive electric component 3 or the interrelated piezoelectric effect-sensitive electric components 3 of the isolated zone 7 are connected electrically via strip conductors 8 which are preferably applied to the surface of the semiconducting layer 1 in form of metallizations either to the housing connections (not shown) of the arrangement or to adjoining arrangements of the same integrated circuit. The entire arrangement with its strip conductors 8 is as a rule covered at the top by at least one passivation layer 9 made of $SiO_2$ and/or $Si_3N_4$ material.

In a region all around the piezoelectric effect-sensitive electric components 3 or around their electric circuits the semiconducting layer 1 is thus markedly tapered from the bottom surface, so that the separate and isolated zone 7 is made of semiconducting material that is connected to the remainder of the semiconducting layer 1 only via well-defined, relatively thin links 6 at the top surface. In addition the isolated zone 7 as seen from the bottom surface of the wafer is slightly thinner than the other, original thickness of the semiconducting layer 1. To equalize the pressure, the space 4 is preferably open at the top through the pressure compensating opening 10. Pressure compensating openings 10 can however also be located towards the bottom, in the support 2. The isolated zone 7 overhangs the interval 4 like a balcony which is suspended from the remaining portion of the semiconducting layer 1 by means of the three troughs made of P+-type material.

In spite of the installation of the semiconducting layer 1 on the support 2, the part of the semiconducting layer 1 containing the piezoelectric effect-sensitive electric component 3 or the interrelated piezoelectric effect-sensitive electric components 3 remains mostly free of internal mechanical tensions in all four embodiments of the invention due to the presence of the space 4, and the piezoelectric effect-sensitive electric components 3 contained therein are thus protected from piezoelectric effects.

The fourth embodiment of the invention (FIG. 4,5) has the advantage that the entire tension-free zone 7 is well isolated electrically against the remainder of the semiconducting layer 1 when the markedly tapered links 6 are made entirely of semiconducting material of a conductivity type that is opposite to that of the semiconducting layer 1, each of the links 6 thereby forming a P/N junction with the isolated zone 7 as well as with the remainder of the semiconducting layer 1, thus achieving an almost perfect electric isolation of the piezoelectric effect-sensitive electric components 3 in the semiconducting layer 1. The links 6 are made preferably in the form of troughs which are diffused into the semiconducting layer 1 starting from the top surface, and the zone 7 is freed up to the troughs by the space 4.

In FIGS. 4 and 5 it was assumed for example that the semiconducting layer 1 is of N-type conductivity. All troughs and all links 6 comprise, in that case, a semiconducting material of P+-type conductivity which is preferably heavily doped with impurity atoms, e.g. atoms of boron. The concentration of boron atoms in that case can be approximately $10^{20}$ per $cm^3$, for example.

Figure 6A:
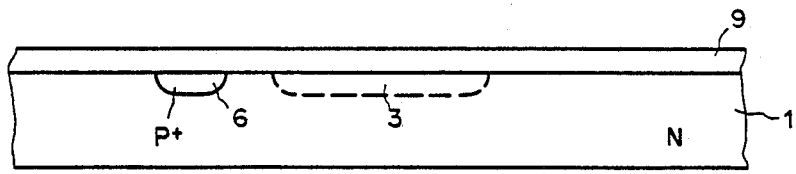

FIGS. 6a to 6e show an illustrative method for producing the fourth embodiment of the invention using an N-type silicon semiconducting material in the form of a (100)-type wafer. First, the electric components or an integrated circuit formed from the electric components are diffused in a known manner at the surface into the wafer material representing the semiconducting layer 1. At a point in time that conveniently fits into the production steps, P+-type troughs are diffused in around the electric components to be isolated mechanically for the purpose of creating the links 6, these troughs then defining the markedly tapered links 6 and thereby the zone 7 to be isolated. Subsequently the strip conductors 8 (not shown) are applied in a known manner and the surface of the arrangement is covered with at least one passivation layer 9. The arrangement thus obtained is shown in FIG. 6a.

Figure 6B:
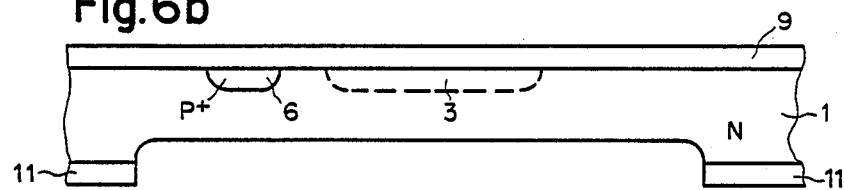

Upon completion of the actual integrated circuit and of its passivation, i.e. by means of a semiconducting layer 1, in which all the electric elements as well as all the troughs of the utilized P+-type conductivity are already diffused and the surface of which is already provided with strip conductors 8 as well as with at least one passivation layer 9, the semiconducting layer 1 is slightly tapered from the bottom surface by means of a first mask 11 made of exposed photoresist material and an isotropic etching process in the area of the zone 7 to be isolated so that said zone 7 is not also attached during subsequent installation on the support material 2. The arrangement thus obtained is shown in FIG. 6b.

Figure 6C:
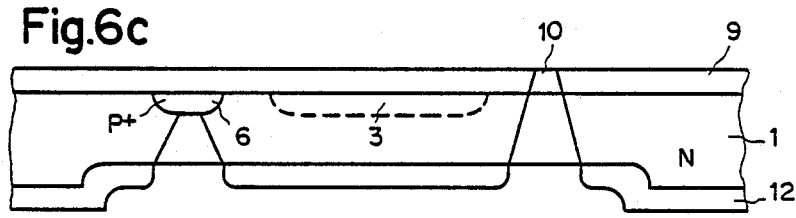

The first mask 11 is then removed chemically and is replaced by a second mask 12 made of exposed photoresist material. The semiconducting layer 1 which is thus obtained is treated again from the bottom surface in a further process step, this time by means of an anisotropic etching process, and is hollowed out all around the zone 7 to be isolated in order to produce the lateral space 4 around the zone 7 to be isolated. The troughs made of semiconducting material of P+-type conductivity act here as etching stops and constitute the links 6, while at the locations where there are no troughs, the semiconducting material 1 and the passivation layer 9 are etched through up to the surface, so that the pressure equalizing openings 10 are formed, going from the space 4 to the surface. The arrangement thus obtained is shown in FIG. 6c.

Figure 6D:
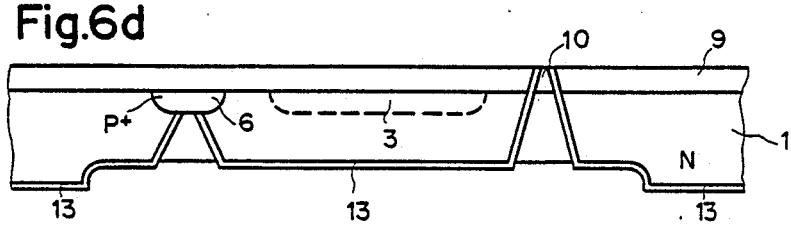

After the removal of the second mask 12, the entire back of the semiconducting material 1 thus obtained is covered with a thin coating layer 13 of P-type conductivity which is opposite to the N-type conductivity of the semiconducting layer 1 in order to isolate the zone 7 electrically. The arrangement thus obtained is shown in FIG. 6d.

Figure 6E:
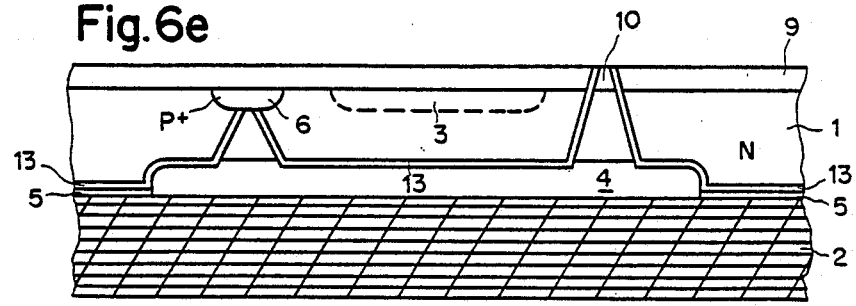

In a last process step the arrangement which is thus obtained is installed on the support 2 by means of a layer of connecting material 5 thereby closing the space 4 towards the bottom. If no pressure equalizing opening 10 exists at the surface of the arrangement, the support 2 must be provided with at least one such pressure equalizing opening 10 in order to ensure pressure equalization in the space 4. The arrangement thus obtained is shown in FIG. 6e. The space 4 is filled with vacuum or gas, i.e. air, in all four embodiments of the arrangement according to the present invention.

The process steps described above may be adapted accordingly if other materials and orientations of the wafer are used.

Finally, the above described embodiments of the invention are intended to be illustrative only. Numerous alternative embodiments may be derived by those skilled in the are without departing from the spirit and scope of the following claims.

We claim:

1. A combination comprising
    a semiconductor body including a zone which is occupied by at least one component having an undesired piezo-electric effect,
    a support for said semiconductor body including a supporting surface to which said semiconductor body is attached, and
    means for reducing said undesired piezo-electric effect in said at least one component by maintaining a space between said zone occupied by said at least one component having said undesired piezo-electric effect and said supporting surface to provide mechanical isolation for said component having said undesired piezo-electric effect.

2. The combination of claim 1 wherein said zone of said semiconductor body overhangs said supporting surface of said support.

3. The combination of one of claims 1 or 2 wherein said zone of said semiconductor body including said at least one component having an undesired piezo-electric effect is of substantially constant thickness.

4. The combination of one of claims 1 or 2 wherein said semiconductor body is attached to said supporting surface of said support by means of a connecting layer, said connecting layer being formed between said supporting surface and a portion of said semiconductor body outside said zone containing said at least one component having an undesired piezo-electric effect.

5. The combination of claim 4 wherein said zone of said semiconductor body containing said at least one component having said undesired piezo-electric effect is thinner than the remainder of said semiconductor body.

6. The combination of claim 4 wherein said semiconductor body is of substantially constant thickness.

7. The combination of one of claims 1 or 2, wherein said zone of said semiconductor body which is occupied by said at least one component having an undesired piezo-electric effect is connected to the remainder of said semiconductor body by a link which is thinner than said zone.

8. The combination of claim 1 wherein said zone of said semiconductor body containing said at least one component having an undesired piezo-electric effect is thinner than the remainder of said semiconductor body so that when said semiconductor body is installed on said supporting surface of said support a space is formed between said zone and said support.

9. The combination of claim 8 wherein said zone is surrounded laterally, at least in part, by said space so that said space separates said zone in part from the remainder of said semiconductor body.

10. The combination of one of claims 8 or 9 wherein said zone comprises semiconductor material of a first conductivity type and wherein at a top surface of said semiconductor body said zone is bounded laterally at least in part by semiconductor material of a second conductivity type.

11. The combination of claim 10 wherein said semiconductor material of said second conductivity type constitutes at least one trough, said trough being diffused into said semiconductor body at said top surface and is thinner than said zone, so that said trough serves to link said zone with the remainder of said semiconductor body.

12. The arrangement of claim 10 wherein said semiconductor material of said conductivity type surrounds said zone laterally in part and said space surrounds said zone laterally in part.

13. The combination of claim 1 wherein said space is filled with a gas.

14. The combination of claim 1 wherein said space is evacuated.

* * * * *